United States Patent [19]

Ragard

[11] 4,213,286
[45] Jul. 22, 1980

[54] COMPONENT SEQUENCING AND TAPING MACHINE

[75] Inventor: Phillip A. Ragard, Binghamton, N.Y.

[73] Assignee: Universal Instruments Corporation, Binghamton, N.Y.

[21] Appl. No.: 935,619

[22] Filed: Aug. 21, 1978

[51] Int. Cl.² .................. B65B 57/10; B65B 13/04; B65B 27/10

[52] U.S. Cl. .................. 53/493; 53/591; 53/594

[58] Field of Search .................. 53/591, 594, 493

[56] References Cited

U.S. PATENT DOCUMENTS 3,421,284  1/1969  Zemek .................. 53/591 X
4,043,094  8/1977  Bohannon .................. 53/591 X

*Primary Examiner*—Travis S. McGehee
*Attorney, Agent, or Firm*—Fidelman, Wolffe & Waldron

[57] ABSTRACT

In an improved machine wherein a plurality of component dispensers transversely deposit individual axial-leaded components on a moving conveyor belt in a preferred sequence for subsequent taping of the leads to form a belt of sequenced components, the rate of component deposition is increased although the linear velocity of the conveyer is decreased. Component leads are received in conveyor notches having a pitch distance which is a submultiple of the spacing between the component dispensers.

3 Claims, 7 Drawing Figures

COMPONENT SEQUENCING AND TAPING MACHINE

BACKGROUND OF THE INVENTION

The present invention relates to an electrical component sequencing and taping machine. More particularly, the present invention relates to a machine for preparing programmed packages of taped components for use in printed circuit board component insertion machines.

It has become the practice in forming printed circuit boards to employ machines to automatically insert components into the boards in desired positions. Two types of automatic insertion machines now in use include those which are supplied by a plurality of separate magazines and taped component sources, the machine being programmed to select and remove desired components from each of the sources, and those of the other type which are supplied with a single pre-programmed component tape or single magazine source. The latter type of insertion machine, and in particular that which employs a single tape, is preferred because of its relatively simple construction and because the taped components are held under positive control thereby permittting highspeed component insertion.

Machines to prepare sequenced component belts from a plurality of separate belts of individual axial leaded components have been developed to meet a growing need for sequenced belts as disclosed in U.S. Pat. No. 3,421,284, issued Jan. 14, 1969, the property of the assignee of this patent. That machine uses a mechanical memory apparatus to control the release of stored components from a plurality of dispensers. The components fall into preselected positions on a moving conveyor which continuously transports sequenced components to a taping mechanism. Taping retains the components in sequence on flexible belts for storage prior to use in a circuit board component insertion machine. More advanced machines now employ electronic curcuity to control the dispensation of components onto the moving conveyer, however the operating principles illuatrated in U.S. Pat. No. 3,421,284 are still applicable and that patent should be considered as incorporated herein by reference. U.S. Pat. No. 3,669,309 also discloses a machine for dispensing components from separate storage units onto a moving conveyor in a selected sequenced order.

While the performance of these machines has been technically satisfactory, the burgeoning demand for belts of sequenced components has led to efforts to accelerate machine output by increasing the speed of the moving conveyor belt past the dispensers. These efforts have been substantially unsuccessful because of the increased momentum of the conveyor elements which contact the component leads. At the original conveyor design speed, the leads of the descending axial leaded components fall into and are retained for transport in uniformly spaced notches along the edges of the conveyor. However, when in order to increase output rate the conveyor speed is substantially increased, the component leads on contact with the fast-moving conveyor, fail to seat in the notches and the component is frequently thrown from the conveyer. This causes work stoppages, potential machine damage and lost efficiency.

What is needed is an improved component sequencing and taping machine which can receive components on the moving conveyor and deliver said components to the taping mechanism at a higher rate while maintaining a complete and properly sequenced arrangement of components.

In the improved machine of this invention the conveyor speed is reduced while the rate of dispensing components is disproportionately increased resulting in closer spacing of components on the conveyor and a higher rate of component delivery to the taping mechanism. The lower linear velocity of the conveyor, and redesigned and newly spaced notches on the conveyor assure retention thereon of the deposited components in proper sequence. Accordingly, the difficulties associated with a higher speed conveyor are avoided while output is increased. In the slower unimproved machine the pitch distance between components on the conveyor equalled the spacing distance between component dispensers. In the improved machine the component pitch distance is reduced to a submultiple of the dispenser spacing distance such that an integral number, e.g., 1, 2, 3, 4, of components are added between the components as they would have been deposited by the unimproved machine.

Other objects advantages and novel features of the present invention will become apparent from the following detailed description of the invention when considered in conjunction with the accompanying drawing in which FIG. 1 is a perspective view of the front of the ntion when considered in conjunction with the accompanying drawing in which FIG. 1 is a perspective view of the front of the improved component sequencing and taping machine of the present invention;

Figure 1:
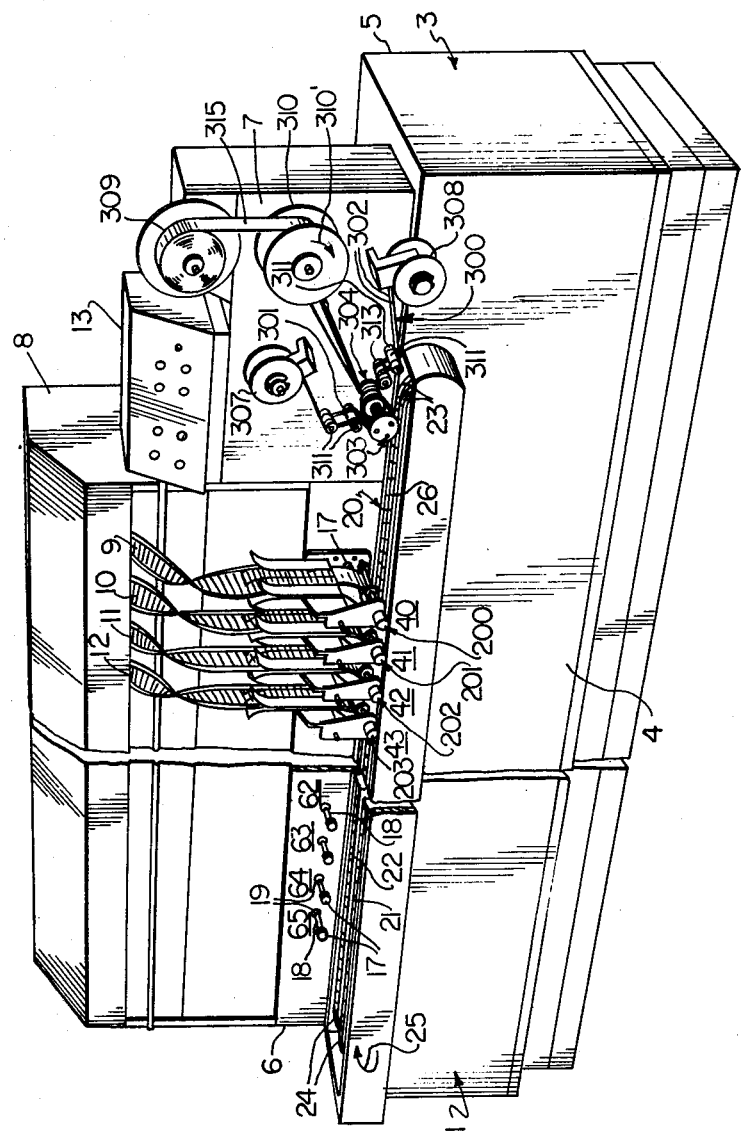

FIG. 1 is a perspective view of the front of the component sequencing and taping machine 1 of the present invention illustrating the relationship between a component conveyor, generally shown as 20; a plurality of dispenser stations, indicated as 40–65; a group of component dispensers, indicated as 200–203; and a taping mechanism, generally shown as 300. Machine 1 also includes a supporting base, generally shown at 3, having front and rear panels 4 and 5, a dispenser front mounting plate 6, a taping mechanism front mounting plate 7, a supply enclosure 8 adapted to support a plurality of component carrying supply tapes, such as 9, 10, 11, and 12, and a control console 13. As generally illustrated in the drawings, each of the dispenser stations 40–65 is provided with a dispenser actuating means which includes a dispenser drive gear 17 affixed to one end of a supporting shaft 18. Shaft 18 is journalled in suitable openings 19 provided in the front mounting plate 6 and rear panel 5, openings 19 being shown only in front plate 6.

For purposes of illustration, machine 1 is described as being employed to sequentially dispense and tape electrical components 100 of the type having a body portion 101 and at least two leads 102 extending from one or both ends of body 101 (FIGS. 2, 3) i.e., axially leaded components.

Control means 13 with an included memory unit (not shown) are employed to actuate the component dispensers, for example 200-203, in a predetermined sequence to deposit successive groups of components 100 on the conveyor 20. The conveyor 20 and the taping mechanism 300 are continuously driven during the sequencing and taping operation.

Further, to facilitate understanding of the present invention, it will be appreciated that in designing the component sequencing and taping machine of the present invention, the maximum number of individual components needed to fabricate the most complex of a given series of circuits or portions thereof would be employed to determine the maximum number of dispenser stations to be provided on the machine, as for instance 40-65 as shown in FIG. 1. Thereafter, when it is desired to tape groups of components for less complete circuits, i.e., having fewer individual components, an operator would select a number of dispensers, as for instance dispensers 200-203 shown in FIG. 1, corresponding to the maximum number of dissimilar components to be employed in the circuit to be fabricated and then supply each of such dispensers with component tapes 9-12; the remaining dispensers either being removed from the machine, as illustrated in FIG. 1, or permitted to remain empty. Then, to prepare the machine for operation, an operator would modify the memory unit (not shown) to permit the dispensers 200-203 to be actuated in a desired sequence. As will be apparent, any given machine may be adapted to tape groups of components having components in excess of the total number of dispenser stations in instances where one or more types of components in any tape group are to be repeated. Thus, a machine having a prescribed number of dispenser stations, can be adapted to form a taped group of components corresponding in number to the number of stations plus one for each repeated component.

Figure 2:
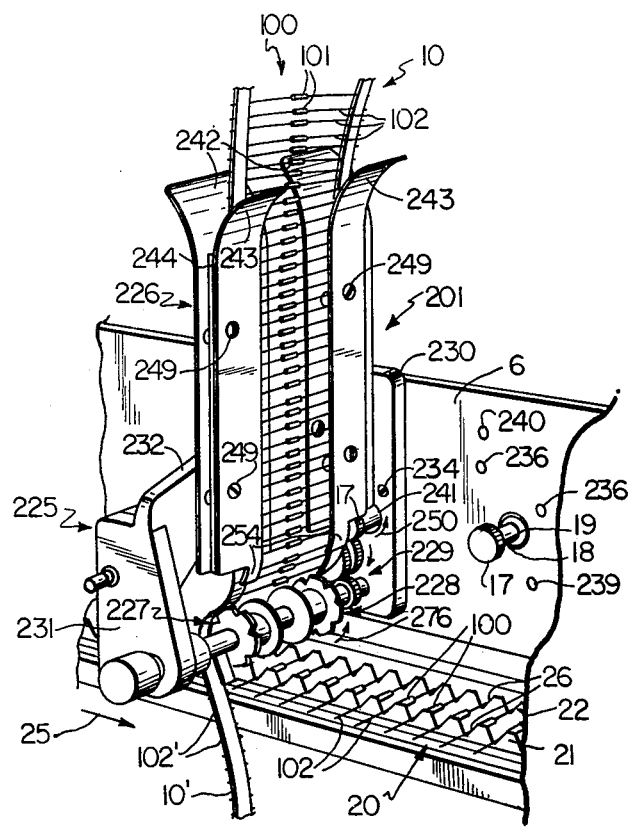
FIG. 2 is a perspective view of the front of a component dispenser and conveyor employed in the machine of FIG. 1.
Figure 5:
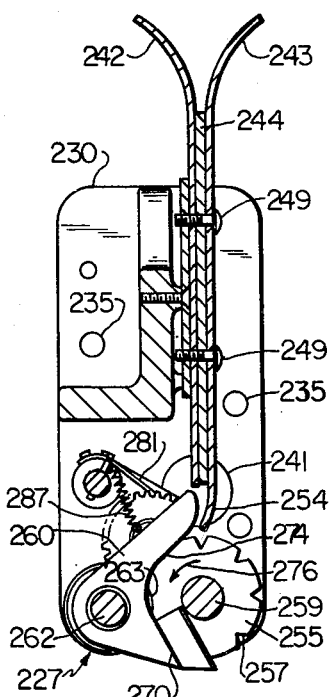
FIG. 5 is a sectional view in side elevation of the dispenser of FIG. 2.
Figure 3:
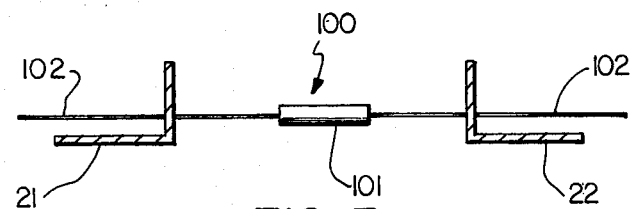
FIG. 3 is a crossectional view of the conveyer carrying an axial leaded component in the machine of FIG. 1.

Referring particularly to FIGS. 1, 2, and 3, conveyor 20 is shown as including a pair of spaced apart endless L-shaped belts 21, 22 which are trained about pairs of sprockets 23 and 24 which drive conveyor 20 in the direction generally indicated by arrow 25. Belts 21, 22 are formed with spaced pairs of opposed V-shaped notches 26 which are adapted to removably receive wire leads 102 of components 100.

Figure 4A:
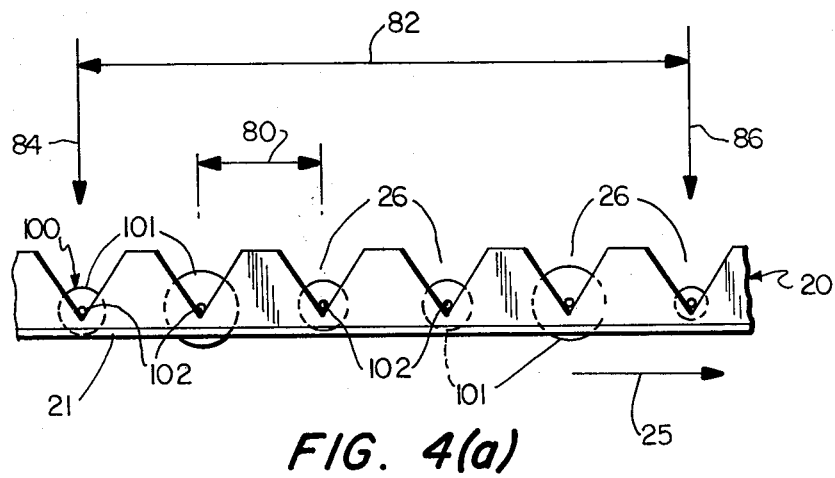
FIG. 4(a) is a side elevational view of the conveyor of FIG. 3.

As illustrated in FIGS. 2, 3, and 4(a), the components 100 are received transversely on the conveyor 20 for transport to the taping mechanism 300 with one lead 102 resting in a notch 26 of one belt 21 and another lead 102 resting in a transversely opposed notch 26 of the other belt 22.

COMPONENT DISPENSER

Figure 6:
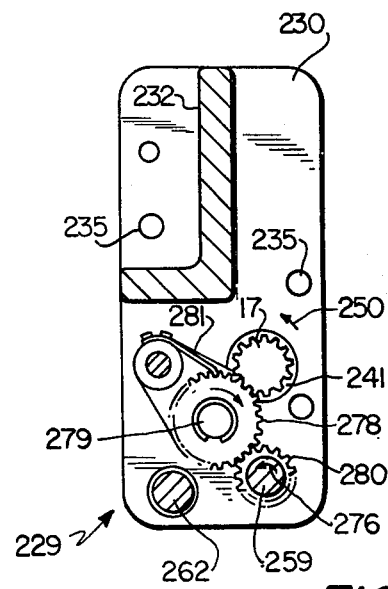
FIG. 6 is a further view similar to FIG. 5 but with parts removed to illustrate the gear train.

Referring to FIG. 1 particularly, it will be seen that dispensers 200-203 are illustrated as being of idential construction and positioned at dispenser stations 40-43, respectively. It will be appreciated that dispensers 200-203 are individually controlled by drive gears 17, mounted one at each of the dispenser stations (FIGS. 1, 2, 6).

In that dispensers 200-203 are of like construction, only dispenser 201 will be described, specific attention being directed to FIG. 2. Dispenser 201 includes an integrally cast dispenser body, generally indicated as 225, on which is supported a component supply tape guide assembly, generally indicated at 226, a pair of component lead feed and cutter mechanisms, generally shown as 227 and 228, and a feed and cutter mechanism drive assembly, generally shown as 229. Dispenser body 225 generally includes a pair of end plates 230 and 231, and vertically disposed tape guide assembly flange 232. The dispenser 201 is attached to the dispenser front mounting plate 6 by screws 234 passing through openings 235 provided in end plate 230.

The component tape guide assembly 226 includes a pair of spaced rear guides 242, a pair of spaced front guides 243 and a pair of guide spacers 244 which are clamped between front and rear guides 242, 243. Together, the guides 242, 243 and inserts 244 act to form a component tape feed channel which may be adjusted to handle components having various lead lengths and thicknesses. The transverse spacing between the guide pairs 242, 243 permit variable size component bodies 101 to be dispensed. Front guides 243 are provided at the lower ends thereof with downwardly and rearwardly curved tab extensions 254. Tabs 254 act to engage the leads 102 of the tape components as they feed out from the channel between guides 242, 243 and guide the leads into the feed and cutter mechanisms 227 and 228.

The feed and cutter mechanisms 227 and 228 include a pair of transversely opposed guide discs 255 which are provided with annularly spaced component lead receiving notches 257 and which are keyed for rotation with shaft 259; a pair of cutter blocks 260 which are loosely journalled on shaft 262; and a pair of cutter discs 263 which are keyed for rotation with shaft 262 and are rotatably received within slot openings (not shown) provided in blocks 260 respectively. It should be understood that each feed and cutter mechanism 227, 228 cuts a single opposed component lead 102. As shown in FIG. 2, the belt of components 100 is inserted between the front and rear guides 242, 243 and threaded downward toward the conveyor 20 so that the component leads 102 are engaged in the notches 257 of the guide discs 255.

Thus, it will be seen that as the feed and cutter mechanism drive assembly 229 rotates shaft 259 in the direction indicated by arrow 276, component leads 102 are received within successively presented guide discs notches 257; the guide surfaces 274 acting to retain component leads 102 within notches 257 as leads 102 are passed into engagement with cutter discs 263. Also, it will be apparent that guide surfaces 274 coact with notches 257 to movably grip the leads 102 of the taped components, whereby the supply component tape 10 is removed from supply enclosure 8 and drawn downwardly through tape guide assembly 226.

From the foregoing it will be apparent that the overall operation of dispenser 201 is as follows. Upon rotation of drive gear 17 in the direction of arrow 250 guide discs 255 are driven in the direction of arrow 276 through the gear train including gear 278 journalled on shaft 279, and gear 280; the rotatably mounted spring stop 281 being progressively stepped with respect to gear 278 against the bias of spring 287. When so driven, guide discs 255 draw component supply tape 10 downwardly through tape supply assembly 226 and force leads 102 of components 100 into cutting engagement with cutter discs 263. Upon continued roation of guide discs 255 as indicated in FIG. 2, the severed ends of component leads 102, indicated as 102' which are affixed to tapes 10', are guided away from conveyor 20 by cutter block guide slots 270 and the severed components 100 fall under the force of gravity into conveyor notches 26 sequenced into position therebeneath.

A more complete and detailed description of such a dispenser 201 and its operation is found in the aforementioned U.S. Pat. No. 3,421,284. For the purposes of disclosing the claimed improvement of this application, the description herein suffices in that it recites the dispenser structure which receives a taped belt 10 of components 100 from a storage enclosure 8. Then the leads 102 of the component 100 are severed in the dispenser 201, thereby separating the component 100 from the tapes 10' which previously retained it. Finally the component 100 drops under gravity from the dispenser 201 onto the moving conveyor 20.

The axial component leads 102 rest in the conveyor notches 26 and, as stated above, the leads 102 extend transversely to the direction 25 of conveyor motion. The action of the dispenser 201 is initiated by rotation of dispenser drive gear 17. After each individual component 100 is released at the lower end of the dispenser 201, as described above, the drive gear 17 is reversibly rotated to its original condition in readiness to drop the next conponent 100 from that supply tape 10. Generally speaking, the control means 13 and memory unit (not shown) cause the dispensers 200–203 to release components 100 onto the conveyor 20 from any supply tape 9–12 in the sequence required to produce the desired sequenced tape output. Synchronism is mechanically and electrically maintained to assure that the conveyor notches 26 are aligned to the proper one of the dispensers 200–203 when each component 100 is released by a dispenser.

Figure 4B:
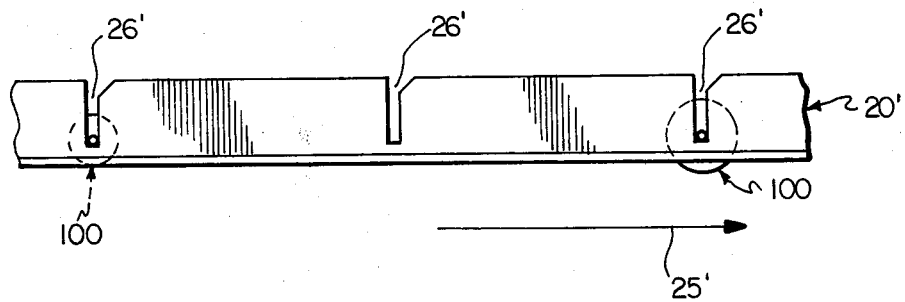
FIG. 4(b) is a side elevational view of a prior art conveyor.

In the improved machine 1 of this invention the pitch distance 80 between notches 26 on the conveyor 20 (FIG. 4(a)) is a submultiple of the spacing distance 82 between each adjacent dispenser 200–203. The arrows 84, 86 are used in FIG. 4(a) to indicate the distance 82 between two adjacent dispensers at the location where components 100 are released proximate the cutter block guide slots 270. In the FIG. 4(a) the notch pitch distance 80 is twenty percent of the spacing 82 between adjacent dispenser heads, e.g., 200, 201. Accordingly, when every notch 26 is filled, five components 100 are received on the conveyor 20 in that distance 82 with the conveyor 20 moving with a linear velocity indicated by the arrow 25. In the unimproved machine, the conveyor 20' (FIG. 4(b)) moved with a greater velocity as indicated by the extended length arrow 25', and components 100 were received in the slots 26' with a component pitch distance equal to the spacing 82 of adjacent dispensers. It will be readily understood that any conveyor velocity 25 in excess of twenty percent of the original velocity 25' can deliver components 100 to the taping mechanism 300 at a rate increased over the original rate even through the conveyor velocity 25 is less than the original velocity 25'. Thus a greater output is delivered although the conveyor 20 moves less rapidly, and the difficulties in effectively receiving components 100 onto the moving conveyor 20 are successfully avoided.

In alternative embodiments of this invention, the pitch distance 80 between notches 26 may be greater or less than the twenty percent of the dispenser spacing 82 as described above. For examples, notch 26 pitch distance 80 may be $\frac{1}{2}$, $\frac{1}{3}$, $\frac{1}{4}$, or 1/5 of nominal dispenser spacing 82. Preferably the pitch distance 80 provides for an equal and integral number of components 100 or notches 26 located on the conveyor 20 for every distance equal to the spacing 82 between dispensers. Such integral submultiples of the dispenser spacing 82 facilitate timing and synchronization between functional members, e.g., gear trains, of the dispensing, conveying and taping mechanisms. Pitch distances of 0.50 and 0.66 inch have performed satisfactorily with a dispenser spacing of 2.00 inches. FIG. 2 illustrates four notches 26 between adjacent drive gears 17.

The components 100 received and retained on the conveyor 20 are transported to the taping mechanism 300. Referring generally to FIG. 1 it will be seen that taping mechanism 300 is disposed adjacent the end of conveyor 20 and is adapted to remove from conveyor 20 and apply pairs of tapes 301, 302 to sequenced components 100. Tapes 301, 302 preferably having pressure sensitive adhesive applied to the surface thereof which is to be brought into engagement with leads 102 of components 100.

Taping mechanism 300 includes a taping head, generally indicated as 303; pressure roller, generally indicated as 304; a pair of tape supply reels 307, 308, a separator web supply reel 309; and a powered wind-up reel 310. Suitable rollers 311 and tension wheel 313 are provided to guide tapes 301, 302 between supply reels 307, 308 and taping head 303.

It will be understood that the taping head 303 and pressure roller 304 are driven, to draw tapes from supply reels 307, 308. If desired the speed of taping head 303 may be varied from that of conveyor 20 to control the spacing between the components 100 as taped. Also, wind-up reel 310 is driven in the direction indicated by arrow 310' by any suitable means, such as electric motor (not shown) to wind-up the taped component groups, and to withdraw a tape separating web 315 from reel 309. Separating web 315 functions to separate the convolutions of the taped components when on reel 310 to prevent frictional contact and interlocking between the components of adjacent convolutions.

Complete details of such a taping mechanism 300 are to be found in U.S. Pat. No. 3,421,284. However, the above description is believed to be adequate for purposes of this application. It is sufficient to understand that the components 100 from the conveyor 20 have their leads 102 pressed by the pressure roller 304 between the two pairs of narrow adhesive tape 301, 302 taken from the tape supply reels 307, 308 in order to produce a component tape which is stored on the wind up reel 310. This component tape at the output of the taping unit 300 is similar to the supply tapes 9–12, except that the reel 310 now stores components 100 in a preferred sequence whereas the supply tapes, e.g. 9, each contained a plurality of like components 100.

While only one type of components dispenser has been specifically described, it will be appreciated that dispensers of other construction may be substituted for or employed in combination with the disclosed dispenser in the practice of the present invention. Alternative dispensers would include gravity feed pre-loaded magazine or pneumatic conveyor dispensers having desired escape mechanisms for depositing upon the conveyor individual components which may have their leads pretrimmed to a desired length.

Further, it will be apparent that the embodiment of the present invention may use a memory which is, for examples, mechanical or a punched paper tape or magnetic memory tape, disc, or drum unit. Also, each embodiment of the present invention may be modified by employing pneumatic or magnetic relays to actuate the individual component dispensers. Other modifications of our machine, but within the scope of the present invention, will in view of the present disclosure become obvious to one having skill in the art, and thus wish to be limited only by the scope of the appended claims, wherein,

What is claimed is:

1. A machine for increased rate of sequencing and taping electrical components said components being characterized by having a body portion and at least one lead extending from each end of said body portion, which comprises in combination: a continuous conveyor movable along a horizontal path at a constant rate; a group of dispensers, dispensers of said group being disposed at spaced points along the path of travel of said conveyor; means for actuating said dispensers; a taping mechanism adapted to apply tape to components deposited on said conveyor by said dispensers, said conveyor and said taping mechanism being adapted to run continuously; and control means, said control means including memory means adapted to control operation of said actuating means such that said dispensers of said group are actuated in a preferred sequence to deposit components into a plurality of notches of said conveyor to form successive predetermined groups of components to be taped and such that one component of each of said groups is in every sequential one of said plurality of notches by the time said conveyor reaches said taping mechanism; said notches opening upwardly to receive said leads of said components deposited on said conveyor, the pitch distance between said notches in the direction of movement of said conveyor being a submultiple less than or equal to one-fifth of the distance between said spaced points of said dispensers, whereby even when said conveyor is moved at a slower constant rate, the output of said machine is increased.

2. The improved machine of claim 1, wherein said submultiple pitch distance yields an integral number of said notches in said distance between said spaced points of said dispensers whereby timing and control is facilitated.

3. The improved machine of claim 2, wherein said notches are V-shaped.

* * * * *